United States Patent
Fukui et al.

[11] Patent Number: 5,846,688
[45] Date of Patent: Dec. 8, 1998

[54] PHOTORESIST COMPOSITION

[75] Inventors: Nobuhito Fukui, Toyonaka; Yuji Ueda, Izumiotsu; Naoki Takeyama, Settu; Takehiro Kusumoto; Yuko Yako, both of Takatsuki; Shigeki Yamamoto, Ibaraki, all of Japan

[73] Assignee: Sumitomo Chemical Company, Limited, Osaka, Japan

[21] Appl. No.: 644,203

[22] Filed: May 10, 1996

[30] Foreign Application Priority Data

May 12, 1995 [JP] Japan ................................. 7-114440
Oct. 26, 1995 [JP] Japan ................................. 7-278902

[51] Int. Cl.⁶ .................................................. G03F 7/039
[52] U.S. Cl. ........................................ 430/270.1; 430/920
[58] Field of Search ................................. 430/270.1, 920

[56] References Cited

U.S. PATENT DOCUMENTS

| | | | |
|---|---|---|---|
| 3,647,448 | 3/1972 | DeMeyer et al. ............................ | 46/48 |
| 4,371,605 | 2/1983 | Renner ................................. | 430/280.1 |
| 5,272,042 | 12/1993 | Allen et al. ........................... | 430/270.1 |
| 5,352,564 | 10/1994 | Takeda et al. .......................... | 430/270.1 |
| 5,403,695 | 4/1995 | Hayase et al. .......................... | 430/270.1 |
| 5,624,787 | 4/1997 | Watanabe et al. ....................... | 430/270.1 |
| 5,679,496 | 10/1997 | Ohsawa et al. ......................... | 430/270.1 |
| 5,700,624 | 12/1997 | Thackeray et al. .................... | 430/270.1 |

FOREIGN PATENT DOCUMENTS

| | | |
|---|---|---|
| 0551105A2 | 7/1993 | European Pat. Off. . |
| 0607899A2 | 7/1994 | European Pat. Off. . |
| 0632327A1 | 1/1995 | European Pat. Off. ............... 430/270 |
| 632327A1 | 1/1995 | European Pat. Off. ............... 430/270 |
| 0709736A1 | 5/1996 | European Pat. Off. . |
| 5341531 | 12/1993 | Japan . |
| 692909 | 4/1994 | Japan . |
| 6214395 | 8/1994 | Japan . |
| 6236024 | 8/1994 | Japan . |

OTHER PUBLICATIONS

Grant et al, eds *Grant & Hackh's Chemical Dictionary*, 5th ed, McGraw–Hill Book Co., New York, NY, 1987, p. 24.

Derwent WPI (Section Ch. Week 9436), Derwent Publications Ltd., London, GB; AN 94–288214 (XP0020303375) & JP 06 214 392A (Sumitomo Chemical Company, Ltd.), 5 Aug. 1994 (Abstract).

*Primary Examiner*—Cynthia Hamilton
*Attorney, Agent, or Firm*—Birch, Stewart, Kolasch & Birch, LLP

[57] ABSTRACT

A positive-working photoresist composition which exhibits a high sensitivity and a high resolution in addition to excellent characteristics such as heat resistance, film retention ratio, coatability and profile;

which comprises an alkali-soluble resin comprising a polyvinylphenol resin which is polyvinylphenol and/or its partially hydrogenated product in which the phenolic hydroxyl groups are partially alkyletherified and partially protected;

and a sulfonate of a N-hydroxyimide compound as an acid generator.

12 Claims, No Drawings

PHOTORESIST COMPOSITION

The present invention relates to a photoresist composition suitable for applications such as photolithography activated by far ultraviolet radiation ( including excimer laser, etc.), electron beam, X-rays or photon radiation.

Hitherto, near ultraviolet radiation has been mainly used in the lithography process. However, due to the on-going progress of high-integration observed in integrated circuits in recent years, formation of submicron patterns on integrated circuits has become required. For the formation of submicron patterns, the attention is focused on radiation sources other than near ultraviolet radiation, particularly on excimer lithography since the process using it makes the manufacture of 64 MDRAM(=Mega-bit random access memory) and 256 MDRAM possible. But the change in the radiation sources has created a demand for photoresists which exhibit following new characteristics:

a) high sensitivity to the above-mentioned radiation sources; and
b) high resolution, in addition to the conventionally required characteristics such as heat resistance, film retention ratio and profile.

Under these circumstances, so-called chemical amplification photoresists, which utilize acid catalyst and the chemical amplification effect, have been proposed. In chemical amplification photoresists, the exposed area is made soluble to developer by a reaction caused by photoirradiation in which an acid generated from the acid generator acts as a catalyst. A positive pattern can be obtained through such a process.

Hitherto, polyvinylphenol resins in which the phenolic hydroxyl groups are protected with groups removable by the action of an acid such as tert-butoxycarbonyl group have been widely used for chemical amplification positive-working resists. However, when the tert-butoxycarbonyl group is used as a protecting group, the improvement of the sensitivity and the developability is limited since this group has significant hydrophobic properties and the resin repels developer when the protection ratio (=ratio of the number of hydroxyl groups protected to the number of total hydroxy groups) is increased. Furthermore, polyvinylphenol resins in which the phenolic hydroxyl group is protected with a tert-butoxycarbonyl group have drawbacks such that they are inferior in heat resistance and are largely influenced by the environment.

An object of the present invention is to provide a positive-working photoresist composition which is excellent in various characteristics such as heat resistance, film retention ratio, coatability and profile, as well as excellent in sensitivity and resolution.

The present inventors have conducted extensive research for achieving said object, and have found that a positive-working photoresist composition having excellent characteristics can be obtained by combining specific ingredients. The present invention was thus completed.

Thus, the present invention provides a positive-working photoresist composition which comprises an alkali-soluble resin and an acid generator; wherein the above-mentioned alkali-soluble resin comprises a polyvinylphenol resin which is polyvinylphenol and/or its partially hydrogenated product in which the phenolic hydroxyl groups are partially alkyletherified and partially protected; and the above-mentioned acid generator comprises a sulfonate of an N-hydroxyimide compound.

In particular, by using the above-mentioned polyvinylphenol resin having a small molecular weight distribution, heat resistance and profile can be further improved.

In the present invention, a polyvinylphenol resin which is a polyvinylphenol and/or its partially hydrogenated product in which the phenolic hydroxyl groups are partially alkyletherified and partially protected is used as the alkali-soluble resin. What is mentioned as "a polyvinylphenol and/or its partially hydrogenated product" means a polymerization product of a compound having a benzene ring to which a hydroxyl group and a vinyl group are connected, i.e. a vinylphenol and/or partially hydrogenated product of vinylphenol. The positions of the hydroxyl group and the vinyl group on the vinyl phenol are not limited, but generally, p-vinylphenol is preferred. Therefore, poly(p-vinylphenol) and a partially hydrogenated poly(p-vinylphenol) are preferably used. The ratio of double bonds on the benzene ring which are saturated by hydrogenation to the total of the saturated and unsaturated double bonds (degree of hydrogenation) is generally 50% or less, and preferably within a range of 2–15%.

The said polyvinylphenol or its partially hydrogenated product is partially alkyletherified. This partial alkyletherification can be carried out by allowing polyvinylphenol or its partially hydrogenated product to react with an alkyl halide under alkaline conditions according to a method described in, for example, N. Rabjohn et al. "Organic Syntheses Collective Volume 4", pp. 836–839, John Wiley & Sons (1963). The alkyl group mentioned here is preferably the one having 1–4 carbon atoms and can be either a straight or branched chain. The alkyl group particularly preferred here is a methyl group or an ethyl group. The halogen atom in the alkyl halide can be a chorine, bromine, iodine atom or the like, but the iodine atom is particularly preferred. Therefore, as the alkyl halide, ethyl iodide or methyl iodide is preferably used. When the degree of hydrogenation is less than 2%, generally, the ratio of the alkyletherified hydroxyl groups to the total of the alkyletherified and unalkyletherified hydroxyl groups in the polyvinylphenol or its partially hydrogenated product (etherification ratio) is preferably in a range of 0.1–35%, and more preferably 1–22%. When the degree of hydrogenation is 2% or more, the etherification ratio is preferably in a range of 0.1–30%, and more preferably in 1–20%.

The partially alkyletherified polyvinylphenol or its partial hydrogenated product is, then, subjected to a process for protecting a part of the remaining phenolic hydroxyl groups. As the protecting group for the phenolic hydroxyl groups in the present invention, an alkoxycarbonylalkyl group, particularly a tert-butoxycarbonylmethyl group, is preferred. This protecting group can be introduced into the phenolic hydroxyl groups according to an ordinary etherification reaction. That is, when an alkoxycarbonylalkyl is used as a protecting group, a part of the phenolic hydroxyl groups can be alkoxycarbonylalkyletherified by allowing an alkyl halogenoalkanate to react with an alkyletherified polyvinylphenol or its partially hydrogenated product under alkaline conditions. The halogen atom in the alkyl halogenoalkanate can be a chlorine, bromine, iodine atom or the like, but, among them, a chlorine or iodine atom is preferred. Since alkyl chloroalkanates are generally more easily available, it is also possible to carry out the reaction using such a chloro compound in the presence of an alkali iodide.

The ratio of the number of hydroxyl groups substituted by protecting groups through such an etherification reaction to the total number of hydroxyl groups which the polyvinylphenol or its partial hydrogenation product originally had (protecting group introduction ratio) is preferably in a range of 1–40%. Furthermore, the ratio of the number of converted hydroxyl groups, including the above-mentioned alkyletherified groups and the protected groups, to the total number of hydroxyl groups which the polyvinylphenol or its partial hydrogenated product originally had (total converted ratio) is preferably in a range of 10–45%.

The polyvinylphenol resin, i.e. a polyvinylphenol or its partial hydrogenated product in which the phenolic hydroxyl groups are partially alkyletherified and partially protected preferably have a polystyrene converted weight-average molecular weight measured by gel permeation chromatography (GPC) within a range of 3,000–35,000. The weight-average molecular weight is more preferably 5000–32,000, further more preferably 5000–25,000, and particularly preferably 5000–20,000. Since the degree of polymerization of the polyvinylphenol or its partially hydrogenated product hardly changes during the above-mentioned alkyletherification reaction and the protecting group introduction reaction (=etherification reaction), it is possible to obtain the weight-average molecular weight within the above-mentioned range after partial alkyletherification and partial protecting group introduction by using a polyvinylphenol or its partially hydrogenated product having a weight-average molecular weight within a range slightly lower the above-mentioned range such as, for example, 3,000–30,000.

Although the molecular weight distribution of the resin, i.e. the weight-average molecular weight/number-average molecular weight ratio, is not particularly limited, it is, however, preferable to use a resin having a small molecular weight distribution. The molecular weight distribution is, generally, within a range of 1–5, but preferably within 1.01–1.5, more preferably within 1.01–1.4, and particularly preferably within 1.01–1.35. A small molecular weight distribution is particularly preferred when the polyvinylphenol resin does not contain its hydrogenated product. By using such a resin, the heat resistance and profile of the photoresist can be more improved.

A polyvinylphenol resin, i.e. polyvinylphenol and/or its partially hydrogenated product in which the phenolic hydroxyl groups are partially alkyletherified and partially protected, can be used singly or in combination of two or more as the alkali-soluble resin in the photoresist composition of the present invention. Furthermore, other alkali-soluble resins can be added insofar as the favorable effects of the present invention are not affected. Other resins that can be added include, for example, polyvinylphenol resins, partially alkyletherified polyvinylphenol resins, polyisopropenylphenol resins, copolymers of vinylphenol and styrene (preferably those in which the ratio of the vinylphenol is 50% by mole or more), copolymers of isopropenylphenol and styrene (preferably those in which the ratio of isopropenylphenol is 50% by mole or more), partially hydrogenated polyvinylphenol resins and partially alkyletherified products of partially hydrogenated polyvinylphenol resins. In addition, other resins having a tert-butoxycarbonylmethyl group or another protecting group removable by the action of an acid can also be used.

The photoresist composition of the present invention comprises a sulfonate of an N-hydroxyimide compound in addition to the above-mentioned alkali-soluble resin. This sulfonate of an N-hydroxyimide compound includes, for example, those represented by the following general formula (I):

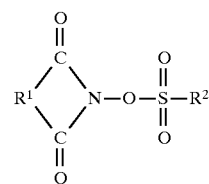

wherein $R^1$ represents an arylene group, an optionally substituted alkylene group or an optionally substituted alkenylene group; $R^2$ represents an alkyl group which may be substituted by a substituent other than a fluorine atom or an aryl group containing no fluorine atom.

The arylene group represented by $R^1$ in the general formula (I) includes, for example, a phenylene or naphthylene group which is unsubstituted or substituted. The substituent of the phenylene and naphthalene group includes, for example, an alkyl group having 1–4 carbon atoms, an alkoxy group having 1–4 carbon atoms, a halogen atom such as a fluorine, chlorine, bromine or iodine atom, a nitro group or an acetylamino group. The phenylene group is preferably 1,2-phenylene, and the naphthylene group is preferably 1,2-naphthylene, 2,3-naphthylene or 1,8-naphthylene.

The alkylene group represented by $R^1$ includes, for example, an alkylene group having 1 to 6 carbon atoms which is unsubstituted or substituted. Furthermore, the alkylene group may be either a straight or branch chain. The preferred alkylene groups include, for example, ethylene, propylene and trimethylene groups. The substituent of the alkylene group includes, for example, a halogen such as a fluorine, chlorine, bromine or iodine atom, an alkoxy group having 1–4 atoms, or a phenyl group unsubstituted or substituted by a substituent such as an alkyl group having 1–4 carbon atoms, an alkoxy group having 1–4 carbon atoms, an halogen atom, a nitro group or an acethylamino group.

The alkenylene represented by $R^1$ includes, for example, those having 2 to 4 carbon atoms which is either unsubstituted or substituted, and is either a straight or branch chain. A preferred alkenylene group includes, for example, a vinylene group. The substituent of the alkylene group includes, for example, a phenyl group unsubstituted or substituted by a substituent such as alkyl group having 1–4 carbon atoms, an alkoxy group having 1–4 carbon atoms, an halogen atom, a nitro group or an acetylamino group.

The alkyl group represented by $R^2$ in the general formula (I) includes, for example, those having 1 to 8 carbon atoms which is unsubstituted or substituted. Furthermore, the alkyl group may be a straight or branch chain or cyclic, i.e. the alkyl group here include a cycloalkyl. However, among them, a straight chain alkyl is preferred. The substituent of the alkyl group includes, for example, a halogen atom other than a fluorine atom, such as a chlorine, bromine or iodine atom, an alkoxy group having 1–4 carbon atoms or a phenyl group unsubstituted or substituted by a substituent such as an alkyl group having 1–4 carbon atoms, an alkoxy group having 1–4 carbon atoms, an halogen atom other than a fluorine atom, a nitro group or an acetylamino group.

The aryl group represented by $R^2$ includes, for example, a phenyl or naphthyl group which is unsubstituted or substituted. The substituent of the phenyl or naphthyl groups includes, for example, an alkyl group having 1–4 carbon atoms, an alkoxy group having 1–4 carbon atoms, an halogen atom other than a fluorine atom, such as a chlorine, bromine or iodine atom, a nitro group or an acetylamino group. The aryl group represented by $R^2$ is preferably a monocyclic one, i.e., an unsubstituted or substituted phenyl group.

The sulfonate represented by the general formula (I) can be produced by allowing an N-hydroxydicarboxyl acid imide, which is produced, for example, according to a method described in G. F. Jaubert, Ber. Dtsch. Chem. 28, 360 (1985), D. E. Ames and al., J. Chem. Soc., 3518 (1955) or M. A. Stolberg et al., J. Amer. Chem. Soc., 79, 2615 (1957), to react with an alkyl sulfonyl chloride or aryl sulfonyl chloride under alkaline conditions according to a method described, for example, in L. Bauer et al., J. Org. Chem. 24, 1293 (1959).

Preferred/examples of the sulfonates represented by the general formula (I) include the following:

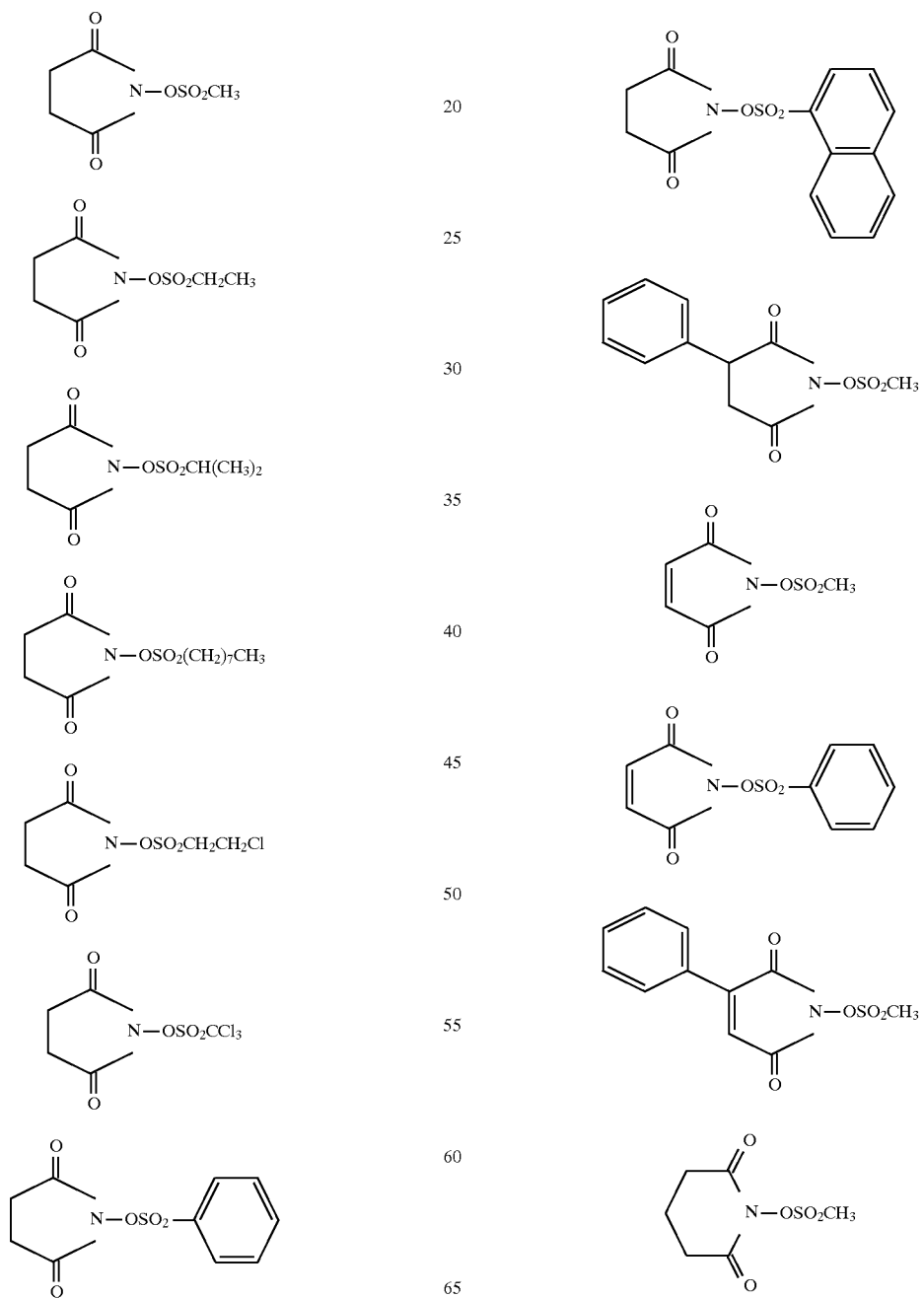

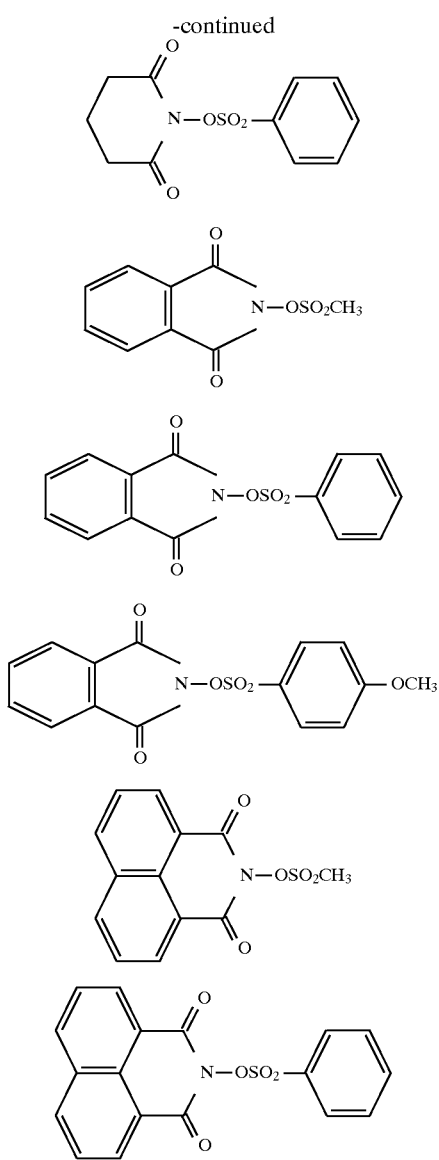

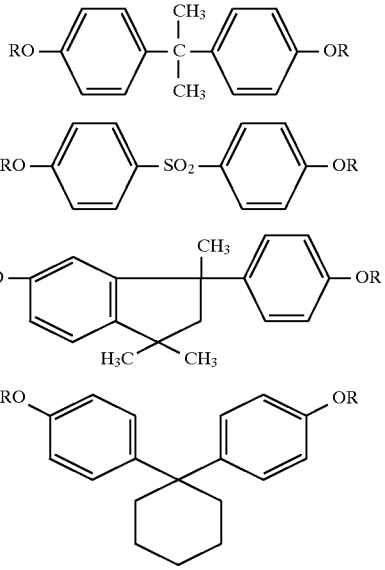

wherein R represents one of the following groups:

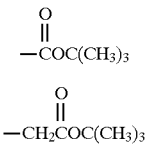

As for acid generators, a sulfonate of N-hydroxyimide compounds such as a sulfonate represented by the above-mentioned general formula(I), can be used singly or in a combination of two or more of those within the above definition.

Preferably, the photoresist composition of the present invention comprising an alkali-soluble resin and an acid generator which have been described above may further comprise an electron donor and/or a dissolution inhibitor.

As the electron donor, those having an oxide-reduction potential of 1.7 eV or less are preferred. As their examples, polynuclear aromatic compounds and heterocyclic aromatic compounds can be mentioned. The preferred electron donor includes, for example, 2-hydroxycarbazole, β-naphthol, 4-methoxynaphthol and indoleacetic acid. Decomposition reaction of the acid generator caused by electron transfer is accelerated by the presence of an electron donor and, as the result, the sensitivity is improved.

The dissolution inhibitor includes, for example, phenolic compounds in which the hydrogen atom of the phenolic hydroxyl group is substituted by a group removable by the action of an acid such as, preferably, a tert-butoxycarbonyl group or a tert-butoxycarbonylmethyl group. These dissolution inhibitors can be used singly or in combination of two or more. For example, compounds described in JP-A-5-341531 (=EP-A-564,997) wherein a tert-butoxycarbonyloxy group is bound to the benzene ring and cyclic carbonate compounds described in JP-A-6-92909 (=EP-A-569,707) can be used. Preferred examples of the dissolution inhibitors include the following:

In the positive-working photoresist composition having a preferred composition ratio, the amount of alkali-soluble resin is in a range of 20–95% by weight, more preferably, 20–90% by weight, and the amount of acid generator is in a range of 0.1–20% by weight based on its total solid weight. When an electron donor is used, its amount is preferably in a range of 0.001–10% by weight, more preferably, 0.001–1% by weight based on the total solid weight. When a dissolution inhibitor is used, its amount is preferably in a range of and 5–50% by weight based on the total solid weight. If necessary, the positive-working photoresist composition of the present invention can further comprise various additives commonly used in this field, such as a sensitizer, a dye and an adhesive property-improving agent.

This positive-working photoresist composition is prepared by mixing the above-mentioned ingredients with a solvent so that the total solid concentration becomes within a range of 10–50% by weight, generally. The resist solution thus obtained is coated onto a substrate such as a silicon wafer. The solvents usable here are those capable of dissolving all the ingredients, and those ordinarily used in this field. Examples of the solvent include a glycolether ester such as ethylcellosolve acetate, methylcellosolve acetate, propyleneglycol monomethylether acetate or propyleneglycol monoethylether acetate; a glycol mono- or diether solvent such as ethyl cellosolve, methyl cellosolve, propyleneglycol monomethylether, propyleneglycol monoethylether or diethyleneglycol dimethylether; an ester such as ethyl lactate, butyl acetate or ethyl pyruvate; a ketone such as 2-heptanone, cyclohexanone or methylisobutylketone and aromatic hydrocarbon such as xylene. These solvents can be used singly or in combination of two or more.

The present invention will now be described more concretely with reference to examples which, however, should not be construed to limit the invention. In the examples, parts are weight basis unless otherwise mentioned. Molecular weights in the examples are polystyrene converted molecular weights measured by GPC.

REFERENCE EXAMPLE 1

(Ethyletherification of Hydrogenated Polyvinylphenol)

10.0 g of Hydrogenated poly(p-vinylphenol) [manufactured by MARUZEN SEKIYU KAGAKU K.K. "Linker PHM-C", weight-average molecular weight: 8,200, molecular weight distribution: 2.26, degree of hydrogenation: 5–10%] was dissolved in 100 ml of acetone. After adding 12.0 g of potassium carbonate and 1.56 g of ethyl iodide thereto, the reaction mixture was refluxed for 6 hours and then filtered. The filtrate was dropwise added into 2 l of an acetic acid aqueous solution at pH 3 to induce reprecipitation and the precipitate was filtered. The filtered resin was dried at 60° C. An acetone solution containing 20% by weight of this resin was then mixed with hexane so that the volume ratio became 2:1, respectively. After stirring the solution thus produced for 1 hour at room temperature, the acetone layer was separated and, then, the acetone layer was added to 2 l of ion exchange water. The solid in it was filtered to obtain hydrogenated poly(p-vinylphenol) wherein 12% of the hydroxyl groups were ethyletherified.

REFERENCE EXAMPLE 2

(Same as Above)

Reference Example 1 was repeated except that 1.95 g of ethyl iodine was used to obtain hydrogenated poly(p-vinylphenol) wherein 15% of hydroxyl groups were ethyletherified.

REFERENCE EXAMPLE 3

(Same as Above)

Reference Example 1 was repeated except that 0.78 g of ethyl iodine was used to obtain hydrogenated poly(p-vinylphenol) wherein 6% of hydroxyl groups were ethyletherified.

REFERENCE EXAMPLE 4

(Ethyletherification of Polyvinylphenol)

10.0 g of Poly(p-vinylphenol) [manufactured by NIPPON SOUDA K.K. "VP-5000", weight-average molecular weight: 12,800, molecular weight distribution: 1.28] was dissolved in 100 ml of acetone. After adding 12.0 g of potassium carbonate and 0.16 g of ethyl iodide thereto, the reaction mixture was refluxed for 6 hours and then filtered. The filtrate was dropwise added into an 2 l of acetic acid aqueous solution at pH 3 to induce a reprecipitation and the precipitate was filtered. The filtered resin was dried at 60° C. An acetone solution containing 20% by weight of this resin was then mixed with hexane so that the volume ratio of them became 2/1, respectively. After stirring the solution thus produced for 1 hour at room temperature, the acetone layer was separated and, then, the acetone layer was added to 2 l of ion exchange water. The solid in it was filtered to obtain poly(p-vinylphenol), wherein 1% of the hydroxyl groups were ethyletherified.

REFERENCE EXAMPLE 5

(Introduction of Protecting Groups)

50.0 g of the resin synthesized in Reference Example 1 was dissolved in 500 ml of acetone. After adding 4.8 g of potassium carbonate, 0.96 g of potassium iodide and 5.0 g of tert-butylchloroacetate, the solution obtained was refluxed for 10 hours. After filtration of the reaction solution, 1 l of methylisobutylketone was mixed to the resin solution thus obtained, and the resulting solution was washed three times with 500 ml of ion-exchange water. The methylisobutylketone was distilled out under reduced pressure to obtain hydrogenated poly(p-vinylphenol), wherein 12% of the hydroxyl groups were ethyletherified and 8% of the hydroxyl groups were tert-butoxycarbonylmethyletherified.

REFERENCE EXAMPLE 6

(Same as Above)

Reference Example 5 was repeated except that the amounts of starting materials, i.e. potassium carbonate, potassium iodide and tert-butylchloroacetate, were changed to 3.0 g, 0.60 g and 3.13 g, respectively. Hydrogenated poly(p-vinylphenol), wherein 12% of the hydroxyl groups were ethyletherified and 5% of the hydroxyl groups were tert-butoxycarbonylmethyletherified was obtained.

REFERENCE EXAMPLE 7

(Same as Above)

50.0 g of the resin synthesized in Reference Example 2 was dissolved in 500 ml of acetone. After adding 3.0 g of potassium carbonate, 0.60 g of potassium iodide and 3.13 g of tert-butylchloroacetate, the solution obtained was refluxed for 10 hours. Thereafter, same post-treatment as that of Reference Example 5 was carried out to obtain hydrogenated poly(p-vinylphenol) wherein 15% of the hydroxyl groups were ethyletherified and 5% of the hydroxyl groups were tert-butoxycarbonylmethyletherified.

REFERENCE EXAMPLE 8

(Same as Above)

50.0 g of the resin synthesized in Reference Example 3 was dissolved in 500 ml of acetone. After adding 9.6 g of potassium carbonate, 1.93 g of potassium iodide and 10.0 g of tert-butylchloroacetate, the solution obtained was refluxed for 10 hours. Thereafter, same post-treatment as that of Reference Example 5 was carried out to obtain hydrogenated poly(p-vinylphenol) wherein 6% of the hydroxyl groups were ethyletherified and 16% of the hydroxyl groups were tert-butoxycarbonylmethyletherified.

REFERENCE EXAMPLE 9

(Same as Above)

50.0 g of the resin synthesized in Reference Example 4 was dissolved in 500 ml of acetone. After adding 12.6 g of potassium carbonate, 2.52 g of potassium iodide and 13.15 g of tert-butylchloroacetate, the solution obtained was refluxed for 10 hours. Thereafter, same post-treatment as that of Reference Example 5 was carried out to obtain poly(p-vinylphenol) wherein 1% of the hydroxyl groups were ethyletherified and 21% of the hydroxyl groups were tert-butoxycarbonylmethyletherified.

EXAMPLE 1

13.5 parts of the resin synthesized in Reference Example 5, 1.35 parts of a dissolution inhibitor A represented by the following formula:

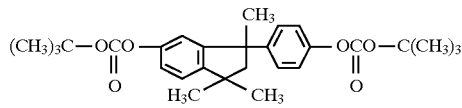

and 1.5 parts of 2-chloroethanesulfonate of N-hydroxysuccinimide as an acid generator were dissolved in 51 parts of diethyleneglycoldimethylether. The solution thus obtained was filtered through a fluoro resin filter having pore diameter of 0.1 μm to obtain a resist solution.

The above-mentioned resist solution was coated, by using a spin coater, on a silicon wafer previously rinsed according to a conventional method so that a 0.7 μm-thick film could be obtained after drying. Then, the silicon wafer was pre-baked on a hot plate at 100° C. for 1 minute and thereafter it was exposed to light through a chrome mask with a pattern by using a KrF excimer laser stepper having a exposure light wavelength of 248 nm (manufactured by NIKKON K.K "NSR-1755 EX8A", NA=0.45). After exposure was completed, the wafer was post-baked on a hot plate at 80° C. for 90 sec. to conduct an elimination reaction of the protecting group in the exposed area. The wafer was then developed with a 2.38% by weight of tetramethylammoniumhydrooxide aqueous solution to obtain a positive-working pattern. The observation of the formed pattern with an electron microscope revealed that a 0.25 μm fine pattern could be resolved with a good profile at an exposure amount of 200 mJ/cm² (248 nm).

EXAMPLE 2

13.5 parts of the resin synthesized in Reference Example 6, 1.35 parts of a dissolution inhibitor A same to the one used in Example 1, 1.5 parts of 2-chloroethanesulfonate of N-hydroxysuccinimide as an acid generator and 0.27 part of 2-hydroxycarbazol as an electron donor were dissolved in 51 parts of diethyleneglycoldimethylether. The solution thus obtained was filtered through a fluoro resin filter having pore diameter of 0.1 μm to obtain a resist solution. Thereafter, same procedures as those in Example 1 were repeated to obtain a positive-working pattern. The observation of the formed pattern with an electron microscope revealed that a 0.25 μm fine pattern could be resolved with a good profile at an exposure amount of 112 mJ/cm² (248 nm). Even when the post-bake was conducted after leaving the exposed wafer for 4 hours, the sensitivity and profile were not changed.

EXAMPLE 3

13.5 parts of the resin synthesized in Reference Example 6, 1.35 parts of a dissolution inhibitor B represented by the following formula:

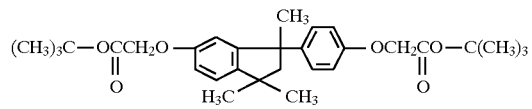

, 1.2 parts of 2-chloroethanesulfonate of N-hydroxysuccinimide as an acid generator and 0.27 part of 2-hydroxycarbazol as an electron donor were dissolved in 66 parts of a mixed solvent consisting of propyleneglycolmonomethyletheracetate/ethyllactate, their weight ratio being 8/2, respectively. The solution thus obtained was filtered through a fluoro resin filter having pore diameter of 0.1 μm to obtain a resist solution. Thereafter, same procedures as those in Example 1, except that the post-bake conditions were changed to 75° C. for 90 sec., were repeated to obtain a positive-working pattern. The observation of the formed pattern with an electron microscope revealed that a 0.25 μm fine pattern could be resolved with a good profile at an exposure amount of 76 mJ/cm² (248 nm).

EXAMPLE 4

1.35 parts of the resin synthesized in Reference Example 1, 12.15 parts of the resin synthesized in Reference Example 7, 1.2 parts of 2-chloroethanesulfonate of N-hydroxysuccinimide as an acid generator and 0.27 part of 2-hydroxycarbazol as an electron donor were dissolved in 66 parts of a mixed solvent consisting of propyleneglycolmonomethyletheracetate/butylacetate, their weight ratio being 8/2, respectively. The solution thus obtained was filtered through a fluoro resin filter having pore diameter of 0.1 μm to obtain a resist solution. Thereafter, same procedures as those in Example 1, except that the post-bake conditions were changed to 85° C. for 90 sec. were repeated to obtain a positive-working pattern. The observation of the formed pattern with an electron microscope revealed that a 0.30 μm fine pattern could be resolved with a good profile at an exposure amount of 92 mJ/cm² (248 nm).

EXAMPLE 4

13.5 parts of the resin synthesized in Reference Example 8 and 1.5 parts of 2-chloroethanesulfonate of N-hydroxysuccinimide as an acid generator were dissolved in 66 parts of a mixed solvent consisting of propyleneglycolmonomethyletheracetate/ethyllactate, their weight ratio being 8/2, respectively. The solution thus obtained was filtered through a fluoro resin filter having pore diameter of 0.1 μm to obtain a resist solution. Thereafter, same procedures as those in Example 1 were repeated to obtain a positive-working pattern. The observation of the formed pattern with an electron microscope revealed that a 0.25 μm fine pattern could be resolved with a good profile at an exposure amount of 136 mJ/cm² (248 nm)

EXAMPLE 6

Example 5 was repeated except that 0.27 part of 2-hydroxycarbazol as an electron donor was added to the resist solution obtained in Example 5. The observation of the formed pattern with an electron microscope revealed that a 0.25 μm fine pattern could be resolved with a good profile at an exposure amount of 54 mJ/cm² (248 nm).

EXAMPLE 7

13.5 parts of the resin synthesized in Reference Example 9, 1.5 parts of 2-chloroethanesulfonate of N-hydroxysuccinimide as an acid generator and 0.27 part of 4-methoxy-1-naphthol as an electron donor were dissolved in 66 parts of a mixed solvent consisting of propyleneglycolmonomethyletheracetate/ethyllactate, their weight ratio being 8/2, respectively. The solution thus obtained was filtered through a fluoro resin filter having pore diameter of 0.1 μm to obtain a resist solution. Thereafter, same procedures as those in Example 1, except that the post-bake conditions were changed to 85° C. for 90 sec., were repeated to obtain a positive-working pattern. The observation of the formed pattern with an electron microscope revealed that a 0.25 μm fine pattern could be resolved with a good profile at an exposure amount of 84 mJ/cm² (248 nm).

REFERENCE EXAMPLE 10

(Ethyletherification of Hydrogenated Polyvinylphenol)

10.0 g of Hydrogenated poly(p-vinylphenol) [manufactured by MARUZEN SEKIYU KAGAKU K.K. "Linker PHM-C", weight-average molecular weight: 8,200, molecular weight distribution: 2.26, degree of hydrogenation: 5–10%] was dissolved in 100 ml of acetone. After adding 12.0 g of potassium carbonate and 1.04 g of ethyl iodide thereto, the mixture was refluxed for 6 hours and then filtered. The filtrate was dropwise added into 2 l of an acetic acid aqueous solution at pH 3 to induce reprecipitation and the precipitate was filtered. The filtered resin was dried at 60° C. An acetone solution containing 20% by weight of this resin was then mixed with hexane so that the volume ratio became 2:1, respectively. After stirring the solution thus produced for 1 hour at room temperature, the acetone layer was separated and, then, the acetone layer was added to 2 l of ion exchange water. The solid in it was filtered to obtain hydrogenated poly(p-vinylphenol), wherein 8% of the hydroxyl groups were ethyletherified.

REFERENCE EXAMPLE 11

(Introduction of Protecting Groups)

50.0 g of the resin synthesized in Reference Example 10 was dissolved in 500 ml of acetone. After adding 10.8 g of potassium carbonate, 2.2 g of potassium iodide and 9.8 g of tert-butylchloroacetate, the solution thus obtained was refluxed for 10 hours. After filtration of the reaction solution, 1 l of methylisobutylketone was mixed to the resin solution thus obtained, and the resulting solution was washed three times with 500 ml of ion-exchange water. The methylisobutylketone was distilled out under reduced pressure to obtain hydrogenated poly(p-vinylphenol), wherein 8% of the hydroxyl groups were ethyletherified and 16% of the hydroxyl groups were tert-butoxycarbonylmethyletherified. The weight average molecular weight of this resin is 10,600 and its molecular weight distribution is 2.28.

EXAMPLE 8

13.5 parts of the resin synthesized in Reference Example 11, 1.5 parts of 2-chloroethanesulfonate of N-hydroxysuccinimide as an acid generator and 0.27 part of 2-hydroxycarbazol as an electron donor were dissolved in 66 parts of a mixed solvent consisting of propyleneglycolmonomethyletheracetate/ethyllactate, their weight ratio being 8/2, respectively. The solution thus obtained was filtered through a fluoro resin filter having pore diameter of 0.1 μm to obtain a resist solution. Thereafter, same procedures as those in Example 1 were repeated to obtain a positive-working pattern. The observation of the formed pattern with an electron microscope revealed that a 0.25 μm fine pattern could be resolved with a good profile at an exposure amount of 68 mJ/cm² (248 nm).

REFERENCE EXAMPLE 12

(Ethyletherification of Monodisperse Polyvinylphenol)

10.0 g of Poly(p-vinylphenol) [manufactured by NIPPON SOUDA K.K. "VP-5000", weight-average molecular weight: 12,800, molecular weight distribution: 1.28] was dissolved in 100 ml of acetone. After adding 12.0 g of potassium carbonate and 1.04 g of ethyl iodide thereto, the reaction mixture was refluxed for 6 hours and then filtered. The filtrate was dropwise added into an 2 l of acetic acid aqueous solution at pH 3 to induce a reprecipitation and the precipitate was filtered. The filtered resin was dried at 60° C. An acetone solution containing 20% by weight of this resin was then mixed with hexane so that their volume ratio became 2/1, respectively. After stirring the solution thus producedfor 1 hour at room temperature, the acetone layer was separated and, then, the acetone layer was added to 2 l of ion exchange water. The solid in it was filtered to obtain poly(p-vinylphenol), wherein 8% of the hydroxyl groups were ethyletherified.

REFERENCE EXAMPLE 13

(Same as Above)

Reference Example 12 was repeated except that 1.56 g of ethyl iodide was used to obtain poly(p-vinylphenol) wherein 12% of the hydroxyl groups were ethyletherified.

REFERENCE EXAMPLE 14

(Same as Above)

10.0 g of Poly(p-vinylphenol) [manufactured by NIPPON SOUDA K.K. "VP-10000", weight-average molecular weight: 25,900, molecular weight distribution: 1.18] was dissolved in 100 ml of acetone. After adding 12.0 g of potassium carbonate and 0.78 g of ethyl iodide thereto, the reaction mixture was refluxed for 6 hours and then filtered. The filtrate was dropwise added into an 2 l of acetic acid aqueous solution at pH 3 to induce a reprecipitation and the precipitate was filtered. The filtered resin was dried at 60° C. An acetone solution containing 20% by weight of this resin was then mixed with hexane so that their volume ratio became 2/1, respectively. After stirring the solution thus produced for 1 hour at room temperature, the acetone layer was separated and, then, the acetone layer was added to 2 l of ion exchange water. The solid in it was filtered to obtain poly(p-vinylphenol), wherein 6% of the hydroxyl groups were ethyletherified.

REFERENCE EXAMPLE 15

(Introduction of Protecting Groups)

50.0 g of the resin synthesized in Reference Example 12 was dissolved in 500 ml of acetone. After adding 9.5 g of potassium carbonate, 1.9 g of potassium iodide and 8.6 g of tert-butylchloroacetate, the solution thus obtained was refluxed for 10 hours. After filtration of the reaction solution, 1 l of methylisobutylketone was mixed to the resin solution thus obtained, and the resulting solution was washed three times with 500 ml of ion-exchange water. The methylisobutylketone was distilled out under reduced pressure to obtain poly(p-vinylphenol), wherein 8% of the hydroxyl groups were ethyletherified and 14% of the hydroxyl groups were tert-butoxycarbonylmethyletherified. The weight average molecular weight of this resin is 14,800 and its molecular weight distribution is 1.28.

REFERENCE EXAMPLE 16

(Same as Above)

Reference Example 15 was repeated except that the amounts of starting materials, i.e. potassium carbonate, potassium iodide and tert-butylchloroacetate, were changed to 10.8 g, 2.2 g and 2.2 g, respectively. Poly(p-vinylphenol), wherein 8% of the hydroxyl groups were ethyletherified and 16% of the hydroxyl groups were tert-butoxycarbonylmethyletherified was obtained. The weight average molecular weight of this resin is 15,200 and its molecular weight distribution is 1.29.

REFERENCE EXAMPLE 17

(Same as Above)

50.0 g of the resin synthesized in Reference Example 13 was dissolved in 500 ml of acetone. After adding 9.4 g of potassium carbonate, 1.9 g of potassium iodide and 8.5 g of tert-butylchloroacetate, the solution obtained was refluxed for 10 hours. Thereafter, same post-treatment as those in Reference Example 15 was repeated to obtain poly(p-vinylphenol), wherein 12% of the hydroxyl groups were ethyletherified and 14% of the hydroxyl groups were tert-butoxycarbonylmethyletherified. The weight average molecular weight of this resin is 15,000 and its molecular weight distribution is 1.28.

REFERENCE EXAMPLE 18

(Same as Above)

50.0 g of the resin synthesized in Reference Example 14 was dissolved in 500 ml of acetone. After adding 10.9 g of potassium carbonate, 2.2 g of potassium iodide and 9.9 g of tert-butylchloroacetate, the solution thus obtained was refluxed for 10 hours. Thereafter, same post-treatment as those in Reference Example 15 was repeated to obtain poly(p-vinylphenol), wherein 6% of the hydroxyl groups were ethyletherified and 16% of the hydroxyl groups were tert-butoxycarbonylmethyletherified. The weight average molecular weight of this resin is 30,400 and its molecular weight distribution is 1.19.

EXAMPLE 9

13.5 parts of the resin synthesized in Reference Example 15, 1.5 parts of 2-chloroethanesulfonate of N-hydroxysuccinimide as an acid generator and 0.27 part of 2-hydroxycarbazol as an electron donor were dissolved in 51 parts of diethyleneglycoldimethylether. The solution thus obtained was filtered through a fluoro resin filter having pore diameter of 0.1 $\mu$m to obtain a resist solution. Thereafter, using the resist solution, same procedures as those in Example 1 were repeated to obtain a positive-working pattern. The observation of the formed pattern with an electron microscope revealed that a 0.25 $\mu$m fine pattern could be resolved with a good profile at an exposure amount of 26 mJ/cm$^2$ (248 nm).

EXAMPLE 10

Example 9 was repeated except that the resin synthesized in Reference Example 15 was replaced with the resin synthesized in Reference Example 16 at the same amount. A 0.25 $\mu$m fine pattern was resolved with a good profile at an exposure amount of 31 mJ/cm$^2$ (248 nm).

EXAMPLE 11

13.5 parts of the resin synthesized in Reference Example 17, 1.2 parts of 2-chloroethanesulfonate of N-hydroxysuccinimide as an acid generator and 0.27 part of 2-hydroxycarbazol as an electron donor were dissolved in 66 parts of a mixed solvent consisting of propyleneglycolmonomethyletheracetate/ethyllactate, their weight ratio being 8/2, respectively. The solution thus obtained was filtered through a fluoro resin filter having pore diameter of 0.1 $\mu$m to obtain a resist solution. Thereafter, using the resist solution, same procedures as those in Example 1 were repeated to form a positive-working pattern. The observation of the formed pattern with an electron microscope revealed that a 0.25 $\mu$m fine pattern could be resolved with a good profile at an exposure amount of 28 mJ/cm$^2$ (248 nm).

EXAMPLE 12

Example 11 was repeated except that the resin synthesized in Reference Example 17 was replaced with the resin synthesized in Reference Example 18 at the same amount and the amount of 2-chloroethanesulfonate of N-hydroxysuccinimide was changed to 1.5 parts. A 0.25 $\mu$m fine pattern was resolved with a good profile at an exposure amount of 35 mJ/cm$^2$ (248 nm).

The 0.25 $\mu$m line and space pattern produced in Example 8 had a little roundish top plane whereas the 0.25 $\mu$m line-and-space patterns produced in Examples 9–12 had a flat top plane and had a good profile. The 2.0 $\mu$m line-and-space patterns produced in Examples 8–12 were heated at 135° C. for 4 minute on a contact type hot plate and, thereafter, heat resistance was evaluated by observing their sectional form with a scanning electron microscope. It has become appeared that all these patterns had maintained a form able to resist to a subsequent etching treatment. However, in the pattern of Example 8, edges at the top plane have disappeared and the top plane has become roundish while, in the patterns of Examples 9–12, their top planes remained flat and edges at top planes remained intact. Thus, it was shown that the patterns produced in Examples 9–12 are superior in heat resistance.

The positive-working photoresist composition of the present invention exhibits a high sensitivity, a high resolution and a good film retention ratio in the field where far ultraviolet radiation (including excimer laser) sources, electron beams, X-rays or photon radiation is used for the exposure. In addition, it is excellent in heat resistance and coatability as well as it has characteristics that it is hardly influenced by the environment. Therefore, in the field of lithography where the above-mentioned radiation sources are used, resolution and contrast can be greatly improved and fine photoresist patterns can be formed with high precision. In particular, the heat resistance and the profile can be improved more by using the above-mentioned polyvinylphenol resin having a small molecular weight distribution.

What we claim is:

1. A positive-working photoresist composition which comprises: an alkali-soluble polyvinylphenol resin which is polyvinylphenol and/or partially hydrogenated polyvinylphenol in which the phenolic hydroxyl groups are partiallyalkyletherified and partially protected by a tert-butoxycarbonylmethyl group; a sulfonate of N-hydroxyimide compound as an acid generator; and an electron donor having an oxidation-reduction potential of 1.7 eV or less.

2. A composition according to claim 1, wherein 0.1–35% of the hydroxyl groups are alkyletherified, and 1–40% of said hydroxyl groups are protected.

3. A composition according to claim 1, wherein said polyvinylphenol resin has a polystyrene-converted weight-average molecular weight of 3,000–35,000 and a molecular weight distribution of 1.01–1.5 measured by gel permeation chromatography.

4. A composition according to claim 1, wherein the sulfonate of a N-hydroxyimide compound is represented by the following general formula (I):

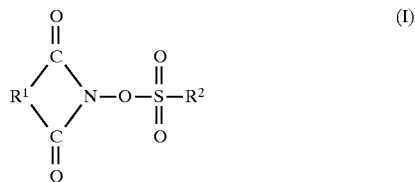

wherein $R^1$ represents an arylene group, an optionally substituted alkylene group or an optionally substituted alkenylene group; and $R^2$ represents an unsubstituted or substituted alkyl group excluding a fluorine atom or an unsubstituted or substituted aryl group excluding a fluorine atom.

5. A composition according to claim 4, wherein the arylene group represented by $R^1$ is a phenylene or naphthylene group which is unsubstituted or substituted, wherein the substituent of the phenylene or naphthylene group is selected from the group consisting of an alkyl group having 1–4 carbon atoms, an alkoxy group having 1–4 carbon atoms, fluorine, chlorine, bromine, iodine, a nitro group and an acetylamino group.

6. A composition according to claim 4, wherein the alkylene group represented by $R^1$ is an alkylene group having 1 to 6 carbon atoms which are unsubstituted or substituted.

7. A composition according to claim 4, wherein the alkyl group represented by $R^2$ has 1 to 8 carbon atoms which are unsubstituted or substituted, wherein the substituent of the alkyl group is selected from the group consisting of chlorine, bromine, iodine, an alkoxy group having 1–4 carbon atoms, and a phenyl group unsubstituted or substituted by a substituent selected from the group consisting of an alkyl group having 1–4 carbon atoms, an alkoxy group having 1–4 carbon atoms, chlorine, bromine, iodine, a nitro group and an acetylamino group.

8. A composition according to claim 4, wherein the aryl group represented by $R^2$ is a phenyl or naphthyl group which is unsubstituted or substituted wherein the substituent is selected from the group consisting of an alkyl group having 1–4 carbon atoms, an alkoxy group having 1–4 carbon atoms, chlorine, bromine, iodine, a nitro group and an acetylamino group.

9. A composition according to claim 1 which comprises 20–95% by weight of alkali-soluble resin and 0.1–20% by weight of an acid generator based on the total solid content in the composition.

10. A composition according to claim 1, wherein the electron donor is present in an amount of 0.001–10% by weight based on the total solid weight in the composition.

11. A composition according to claim 1 which further comprises a dissolution inhibitor comprising a phenol compound wherein the hydrogen atom of the phenolic hydroxyl groups is substituted by a group removable by the action of an acid.

12. A composition according to claim 11 which comprises a dissolution inhibitor in an amount of 5–50% by weight based on the total solid weight in the composition.

* * * * *